(12) United States Patent
Shin et al.

(10) Patent No.: US 12,347,495 B2
(45) Date of Patent: Jul. 1, 2025

(54) MEMORY DEVICE

(71) Applicant: SK hynix Inc., Icheon-si (KR)

(72) Inventors: Hyun Seob Shin, Icheon-si (KR); Dong Hun Kwak, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 183 days.

(21) Appl. No.: 18/095,306

(22) Filed: Jan. 10, 2023

(65) Prior Publication Data

US 2023/0298669 A1    Sep. 21, 2023

(30) Foreign Application Priority Data

Mar. 21, 2022   (KR) ........................ 10-2022-0034849

(51) Int. Cl.
*G11C 16/10*      (2006.01)
*G11C 16/34*      (2006.01)

(52) U.S. Cl.
CPC ........ *G11C 16/102* (2013.01); *G11C 16/3459* (2013.01)

(58) Field of Classification Search
CPC ............................ G11C 16/102; G11C 16/3459
USPC ................................................. 365/189.011
See application file for complete search history.

(56) References Cited

U.S. PATENT DOCUMENTS

| 10,360,974 B2 | 7/2019 | Kondo | |
|---|---|---|---|
| 2007/0058446 A1* | 3/2007 | Hwang | G11C 16/3445 365/185.29 |
| 2012/0170364 A1* | 7/2012 | Jang | G11C 16/3459 365/185.03 |

FOREIGN PATENT DOCUMENTS

KR           101798013 B1       11/2017

* cited by examiner

*Primary Examiner* — Anthan Tran
(74) *Attorney, Agent, or Firm* — WILLIAM PARK & ASSOCIATES LTD.

(57) ABSTRACT

A memory device includes a plurality of memory cells, where each memory cell is configured to be in an erased state or one of a plurality of program states according to data stored therein. The memory device also includes a peripheral circuit configured to, in a program operation on the plurality of memory cells, perform a first program voltage application operation on first memory cells, the first memory cells being to be programmed to first respective program states. The peripheral circuit is also configured to perform, after the first program voltage application operation, a pre-program voltage application operation on second memory cells, the second memory cells being to be programmed to second respective program states.

21 Claims, 12 Drawing Sheets

| PRGDT | | | | | | | | |
|---|---|---|---|---|---|---|---|---|
| | ER | P1 | P2 | P3 | P4 | P5 | P6 | P7 |
| MSB | 1 | 1 | 1 | 0 | 0 | 0 | 0 | 1 |
| CSB | 1 | 1 | 0 | 0 | 1 | 1 | 0 | 0 |
| LSB | 1 | 0 | 0 | 0 | 0 | 1 | 1 | 1 |

⇩ Data conversion operation

| CVDT | | | | | | | | |
|---|---|---|---|---|---|---|---|---|
| | ER | P1 | P2 | P3 | P4 | P5 | P6 | P7 |
| MSB | 1 | 0 | 0 | 1 | 0 | 1 | 1 | 0 |
| CSB | 1 | 0 | 0 | 0 | 1 | 1 | 0 | 1 |
| LSB | 1 | 0 | 1 | 0 | 0 | 0 | 1 | 1 |

MEMORY DEVICE

CROSS-REFERENCES TO RELATED APPLICATION

The present application claims priority under 35 U.S.C. § 119(a) to Korean application number 10-2022-0034849, filed on Mar. 21, 2022, in the Korean Intellectual Property Office, which is incorporated herein by reference in its entirety.

BACKGROUND

1. Technical Field

Various embodiments generally relate to an electronic device, and more particularly, to a memory device.

2. Related Art

A memory device may be, for example, a volatile memory device, which loses data stored therein when power is removed, or a nonvolatile memory device, which maintains data stored therein even when power is removed.

A volatile memory device may be, for example, a DRAM (dynamic random access memory), an SRAM (static random access memory), etc. A nonvolatile memory device may be, for example, a ROM (read only memory), a PROM (programmable ROM), an EPROM (electrically programmable ROM), an EEPROM (electrically erasable and programmable ROM), a NAND flash memory, etc.

A memory device may include a plurality of memory cells and may be configured to perform a program operation, a read operation, and/or an erase operation on the memory cells.

SUMMARY

Various embodiments are directed to a memory device that performs a program operation.

In an embodiment, a memory device may include a plurality of memory cells each configured to be in an erased state or one of a plurality of program states according to data stored therein. The memory device may also include a peripheral circuit configured to, in a program operation on the plurality of memory cells, perform a first program voltage application operation on first memory cells among the plurality of memory cells, the first memory cells being to be programmed to first respective program states, and perform, after the first program voltage application operation, a pre-program voltage application operation on second memory cells among the plurality of memory cells, the second memory cells being to be programmed to second respective program states.

In an embodiment, a memory device may include a plurality of memory cells each configured to be in an erased state or one of a plurality of program states according to data stored therein. The memory device may also include a peripheral circuit configured to, in a program operation on the plurality of memory cells, perform a first program voltage application operation on first memory cells among the plurality of memory cells, perform a pre-program voltage application operation on second memory cells among the first memory cells, and perform a data conversion operation in parallel with the pre-program voltage application operation.

In an embodiment, a memory device may include a plurality of memory cells each configured to be in an erased state or one of a plurality of program states according to data stored therein. The memory device may also include a peripheral circuit configured to, in a program operation on the plurality of memory cells, determine first memory cells among the plurality of memory cells to apply a first program voltage to program the first memory cells to first respective program states, and determine second memory cells from among the first memory cells to be in respective selected program states among the program states while the first program voltage is applied.

The present disclosure presents a memory device. Various embodiments are described in the present disclosure, however, it should be noted that the present disclosure may allow other embodiments to be carried out by a person skilled in the art.

DETAILED DESCRIPTION

Figure 1:
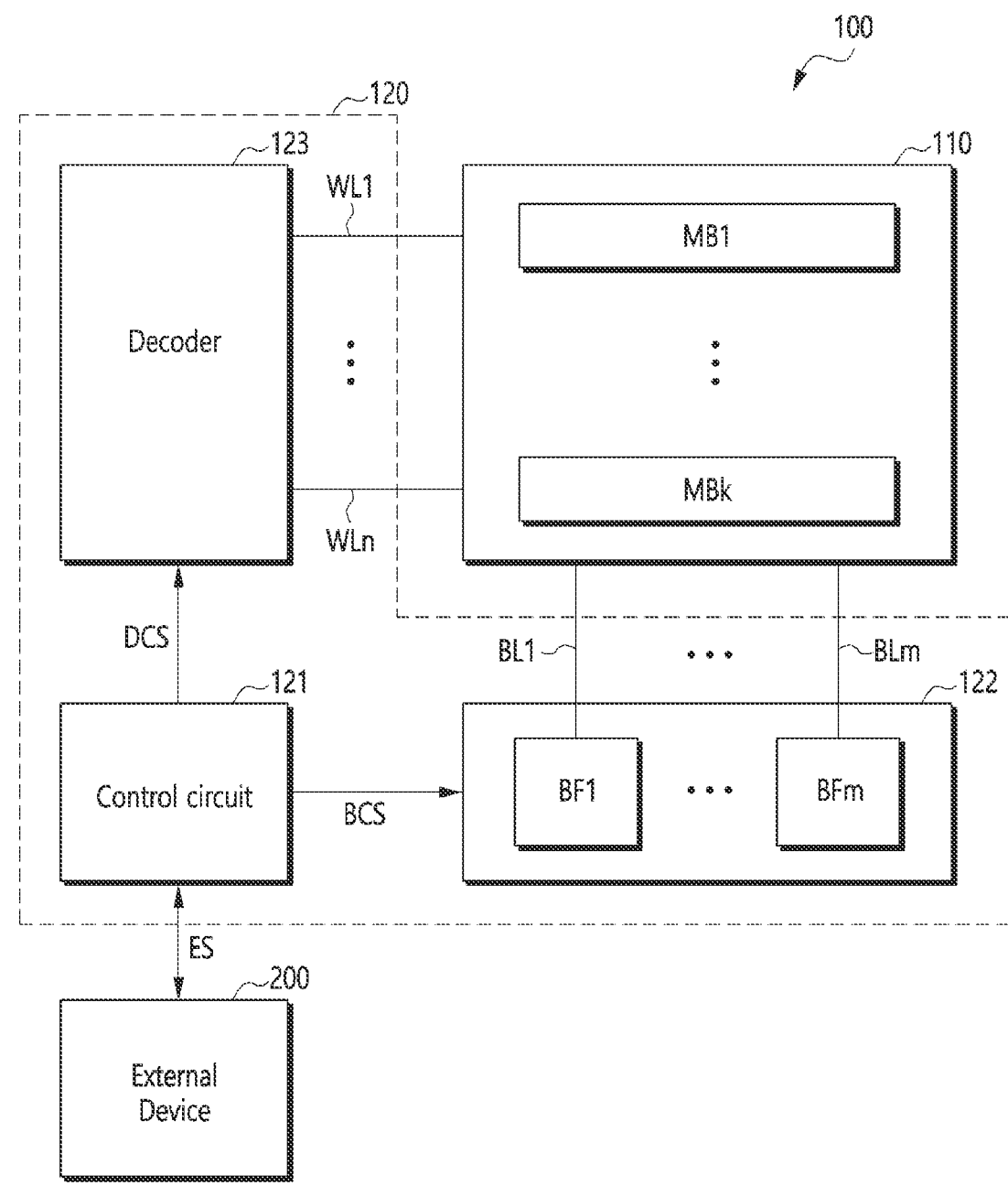
FIG. 1 is a block diagram illustrating an example memory device in accordance with an embodiment of the present disclosure.

In the present disclosure, advantages, features, and methods for achieving them will become more apparent after a reading of the following example embodiments taken in conjunction with the accompanying drawings. The present disclosure may, however, be embodied in different forms and should not be construed as being limited to the embodiments set forth herein. Rather, these embodiments are provided to describe the present disclosure in detail to the extent that a person skilled in the art to which the disclosure pertains can carry out the technical facets of the present disclosure.

It is to be understood that embodiments of the present disclosure are not limited to the particulars shown in the drawings and that the drawings are not necessarily to scale. In some instances proportions may have been exaggerated in order to more clearly depict certain features of the disclosure. While particular terminology is used herein, it is to be appreciated that the terminology used herein is for the purpose of describing particular embodiments only and is not intended to limit the scope of the present disclosure.

As used herein, the term "and/or" includes any and all combinations of one or more of the associated listed items. It will be understood that when an element is referred to as being "on," "connected to," or "coupled to" another element, it may be directly on, connected or coupled to the other element, or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, embodiments of the present disclosure will be described in detail with reference to the accompanying drawings.

FIG. 1 is a block diagram illustrating an example memory device 100 in accordance with an embodiment of the present disclosure.

Referring to FIG. 1, the memory device 100 may include a memory cell array 110 and a peripheral circuit 120.

The memory cell array 110 may include a plurality of memory blocks MB1 to MBk, where a memory block may be a unit by which the memory device 100 performs an erase operation. That is, data stored in a memory block may be erased simultaneously. Each of the memory blocks MB1 to MBk may include a plurality of memory cells in which data are stored. A memory cell may be configured to be in an erased state or one of a plurality of program states according to data stored therein. The memory cells may be arranged in a two-dimensional structure in which the memory cells are arranged parallel to a substrate or a three-dimensional structure in which the memory cells are stacked on a substrate in a vertical direction.

The peripheral circuit 120 may perform a program operation, a read operation, or an erase operation on the memory cell array 110 according to external control. The peripheral circuit 120 may receive external signals ES that may include a command, address, and/or data from an external device 200, and may perform an internal operation of the memory device 100 in response to the external signals ES. The external device 200 may be, for example, a host external to the memory device 100 that is configured to use the memory device 100. While the external signals ES is shown as coming from an external device 200, in some cases, the external signals ES may be provided by a device that is external to the peripheral circuit 120, or in some embodiments even a part of the peripheral circuit 120.

In detail, in a program operation on a plurality of memory cells, the peripheral circuit 120 may perform a first program voltage application operation on first memory cells that are to be programmed to their respective program states. A pre-program voltage application operation may then be performed on second memory cells that are to be programmed to their respective selected program states among the plurality of program states. After performing the pre-program voltage application operation, the peripheral circuit 120 may perform a first verify voltage application operation.

According to an embodiment, the one or more selected program states may include a most significant program state among the plurality of program states. For example, if there are seven program states P1 to P7, the most significant program state may be the seventh program state P7. The most significant program state may also be referred to as an upper program state. This is explained more with respect to FIGS. 6A and 6B.

Before performing the first program voltage application operation, the peripheral circuit 120 may perform a first program setup operation. The first program setup operation may include determining the first memory cells based on program data received from, for example, the external device 200.

According to an embodiment, the peripheral circuit 120 may perform a data conversion operation in parallel with the first program voltage application operation. The data conversion operation may include converting the program data received from, for example, the external device 200 into converted data. After performing the data conversion operation and before performing the pre-program voltage application operation, the peripheral circuit 120 may perform a pre-program setup operation. The pre-program setup operation may include determining the second memory cells based on the converted data.

According to an embodiment, the peripheral circuit 120 may perform a pre-program setup operation in parallel with the first program voltage application operation. The pre-program setup operation may include determining the second memory cells based on the program data received from, for example, the external device 200. The peripheral circuit 120 may perform a data conversion operation in parallel with the pre-program voltage application operation. The data conversion operation may include converting the program data received from, for example, the external device 200 into converted data. Accordingly, in one embodiment, the second memory cells may be determined based on the converted data while in another embodiment, the second memory cells may be determined based on the program data.

The peripheral circuit 120 may include a control circuit 121, a buffer group 122, and a decoder 123.

The control circuit 121 may control general operation of the memory device 100 according to the external signals ES received from the external device 200. The control circuit 121 may generate buffer control signals BCS based on the external signals ES and output the buffer control signals BCS to the buffer group 122. The control circuit 121 may generate decoder control signals DCS on the basis of the external signals ES and output the decoder control signals DCS to the decoder 123. For example, the decoder control signals DCS may include various levels of program voltages and verify voltages required in a program operation. Although not illustrated, the control circuit 121 may include, for example, an interface for communicating with one or more external devices 200, a voltage generation circuit to generate voltages of various levels, and so forth.

The buffer group 122 may be coupled to the memory cell array 110 through bit lines BL1 to BLm. The buffer group 122 may include a plurality of buffers BF1 to BFm coupled to the bit lines BL1 to BLm, respectively. The plurality of buffers BF1 to BFm may temporarily store program data to be stored in memory cells (i.e., target memory cells) for which a program operation is to be performed. The plurality of buffers BF1 to BFm may operate simultaneously in response to the buffer control signals BCS and, accordingly, program operations on the target memory cells may be performed simultaneously.

Before the first program voltage application operation is performed by the decoder 123, the buffer group 122 may perform the first program setup operation under the control of the control circuit 121. The first program setup operation may include determining first memory cells among the target memory cells based on the program data received from the external device 200. The first memory cells may be the target memory cells that are to be programmed according to commands from, for example, the external device 200.

According to an embodiment, while the first program voltage application operation is performed by the decoder 123, the buffer group 122 may perform the data conversion operation under the control of the control circuit 121. The data conversion operation may include converting the program data received from the external device 200 into converted data. After the data conversion operation is completed, the buffer group 122 may perform the pre-program setup operation under the control of the control circuit 121. The buffer group 122 may perform the pre-program setup operation before the pre-program voltage application operation is performed by the decoder 123. The pre-program setup operation may include determining second memory cells based on the converted data. The second memory cells may be at least a portion of the target memory cells that are to be programmed to their respective program states.

According to an embodiment, while the first program voltage application operation is performed by the decoder 123, the buffer group 122 may perform the pre-program setup operation under the control of the control circuit 121. The pre-program setup operation may include determining the second memory cells based on the program data received from the external device 200. The second memory cells may be at least a portion of the target memory cells that are to be programmed to their respective program states. After the pre-program setup operation is completed, the buffer group 122 may perform the data conversion operation under the control of the control circuit 121. The buffer group 122 may perform, for example, the data conversion operation while the pre-program voltage application operation may be performed by the decoder 123.

The decoder 123 may be coupled to the memory cell array 110 through word lines WL1 to WLn. Under the control of the control circuit 121, the decoder 123 may select a word line (i.e., a target word line) coupled to the target memory cells among the word lines WL1 to WLn and may apply various levels of program voltages and verify voltages to the target word line.

In detail, under the control of the control circuit 121, the decoder 123 may sequentially perform the first program voltage application operation, the pre-program voltage application operation, and the first verify voltage application operation on the target word line. The first program voltage application operation may include applying a first program voltage to the target word line. The pre-program voltage application operation may include applying a pre-program voltage to the target word line. The first verify voltage application operation may include applying a first verify voltage to the target word line.

Figure 2:
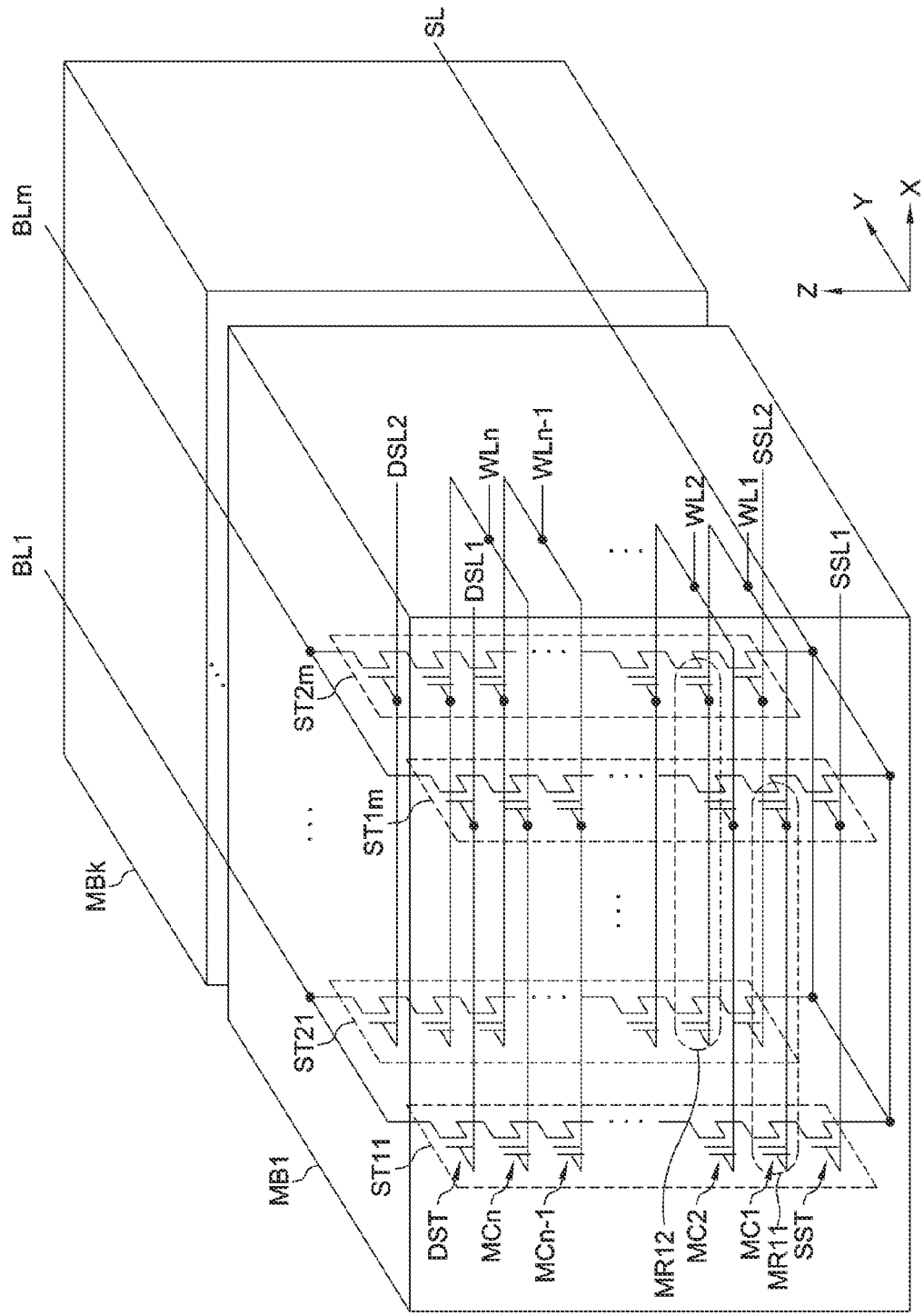
FIG. 2 is a circuit diagram illustrating an example memory block in accordance with an embodiment of the present disclosure.

FIG. 2 is a circuit diagram illustrating the example memory block MB1 in accordance with an embodiment of the present disclosure. Each of the other memory blocks of FIG. 1 may be configured similarly to the memory block MB1 of FIG. 2.

Referring to FIG. 2, the memory block MB1 may include strings ST11 to ST1m and ST21 to ST2m. Each of the strings ST11 to ST1m and ST21 to ST2m may extend in a vertical direction (Z direction). In the memory block MB1, m number of strings may be arranged in a row direction (X direction). FIG. 2 illustrates that two strings are arranged in a column direction (Y direction). However, this is for the sake of convenience in explanation, and at least three strings may be arranged in the column direction (Y direction).

The strings ST11 to ST1m and ST21 to ST2m may be configured similarly. For example, the string ST11 may include a source select transistor SST, memory cells MC1 to MCn and a drain select transistor DST that may be coupled in series between a source line SL and a bit line BL1. The source terminal of the source select transistor SST may be coupled to the source line SL, and the drain terminal of the drain select transistor DST may be coupled to the bit line BL1. The memory cells MC1 to MCn may be coupled in series between the source select transistor SST and the drain select transistor DST.

The gates of source select transistors of strings arranged in the same row may be coupled to the same source select line. For example, the gates of source select transistors of the strings ST11 to ST1m of a first row may be coupled to a source select line SSL1. The gates of source select transistors of the strings ST21 to ST2m of a second row may be coupled to a source select line SSL2. As another embodiment, the gates of the source select transistors of the strings ST11 to ST1m and ST21 to ST2m may be coupled in common to one source select line. Accordingly, different embodiments may have different sets of source select transistors coupled to a single source select line.

The gates of drain select transistors of strings arranged in the same row may be coupled to the same drain select line. For example, the gates of drain select transistors of the strings ST11 to ST1m of the first row may be coupled to a drain select line DSL1. The gates of drain select transistors of the strings ST21 to ST2m of the second row may be coupled to a drain select line DSL2.

Strings arranged in the same column may be coupled to the same bit line. For example, the strings ST11 and ST21 of a first column may be coupled to the bit line BL1. The strings ST1m and ST2m of an mth column may be coupled to a bit line BLm.

The gates of memory cells that are at the same position in the vertical direction may be coupled to the same word line. For example, in the strings ST11 to ST1m and ST21 to ST2m, memory cells at the same position as the memory cell MC1 in the vertical direction may be coupled to a word line WL1.

Among the memory cells, those that are coupled to the same word line in the same row may be part of a single memory region. For example, memory cells that are coupled to the word line WL1 in the first row may be part of a memory region MR11. Memory cells that are coupled to the word line WL1 in the second row may be part of a memory region MR12. Depending on the number of rows, each word line may be coupled to a plurality of memory regions, Memory cells in a single memory region may be programmed simultaneously. The single memory region may be referred to, for example, as a page.

According to an embodiment, the memory block MB1 may be further coupled to one or more dummy word lines other than the word lines WL1 to WLn and may further include dummy memory cells that are coupled to the dummy word lines.

Figure 3:
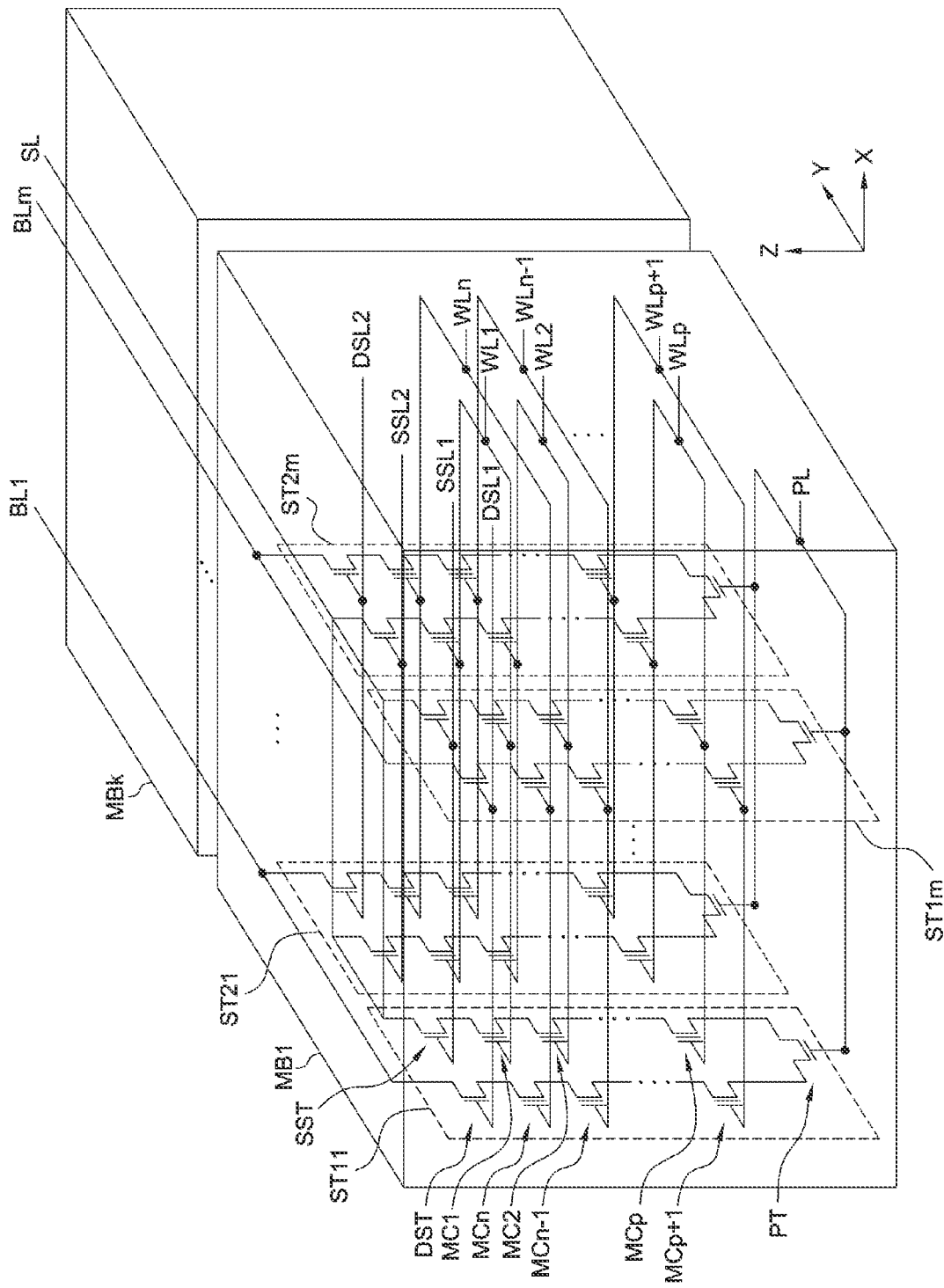
FIG. 3 is a circuit diagram illustrating an example memory block in accordance with an embodiment of the present disclosure.

FIG. 3 is a circuit diagram illustrating the example memory block MB1 in accordance with an embodiment of the present disclosure. Each of the other memory blocks of FIG. 1 may be configured similarly to the memory block MB1 of FIG. 3.

Referring to FIG. 3, the memory block MB1 may include a plurality of strings ST11 to ST1m and ST21 to ST2m. Each of the strings ST11 to ST1m and ST21 to ST2m of FIG. 3 may be configured and operate similarly to each of the strings ST11 to ST1m and ST21 to ST2m of FIG. 2. However, each of the strings ST11 to ST1m and ST21 to ST2m of FIG. 3 is formed in a U shape and may further include a pipe transistor PT. The gate of the pipe transistor PT may be coupled to a pipeline PL. Among memory cells MC1 to MCn, memory cells MC1 to MCp may be sequentially arranged in the reverse direction of the Z direction (i.e., from top to bottom), and may be coupled in series between a source select transistor SST and the pipe transistor PT. Among the memory cells MC1 to MCn, memory cells MCp+1 to MCn may be sequentially arranged in the Z direction (i.e., from bottom to top), and may be coupled in series between the pipe transistor PT and the drain select transistor DST.

Figure 4:
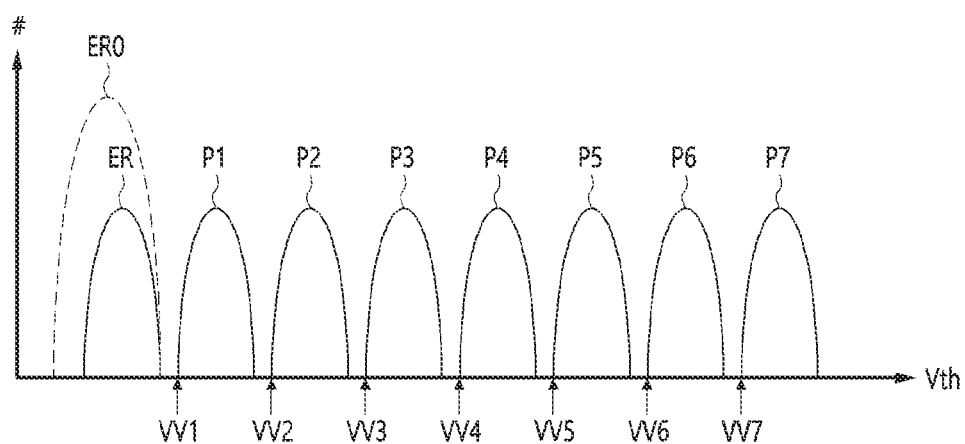
FIG. 4 is a diagram illustrating example states of memory cells in which data are stored according to an embodiment of the present disclosure.

FIG. 4 is a diagram illustrating example states of memory cells in which data are stored according to an embodiment of the present disclosure. The example states may comprise an erased state ER0 and first to seventh program states P1 to P7. In FIG. 4, the horizontal axis Vth indicates the threshold voltage of a memory cell, and the vertical axis # indicates the number of memory cells.

Referring to FIG. 4, a plurality of target memory cells which are coupled in common to a target word line may exist in an erased state ER0 before data are stored therein.

When a program operation is performed, the target memory cells may be applied with a program voltage through the target word line. Accordingly, threshold voltages of some target memory cells may rise, and the target memory cells may remain in the erased state ER or in one of the first to seventh program states P1 to P7. The erased state ER and the first to seventh program states P1 to P7 may correspond to different data. When each memory cell stores 3 bits as a triple level cell (TLC) through the program operation, a total of eight states may exist as illustrated. According to an embodiment, when each memory cell stores i bits, a total of $2^i$ states may exist.

In an example program operation, in order to verify whether a target memory cell is in an appropriate state, first to seventh verify voltages VV1 to VV7 may be applied to the target word line. For example, when the first verify voltage VV1 is applied to the target word line, a target memory cell that has a threshold voltage lower than the first verify voltage VV1 may be turned on and allow current to flow. However, when the first verify voltage VV1 is applied to the target word line, the target memory cell that has a threshold voltage higher than the first verify voltage VV1 may be turned off and no current may flow. Among the buffers BF1 to BFm in the buffer group 122 of FIG. 1, a buffer that is coupled to the target memory cell by a bit line may sense via the bit line whether there is current flowing through the target memory cell. Accordingly, the buffer group 122 may determine read data based on a sensing result and may determine the state of the target memory cell based on the read data. According to various embodiments, verify voltages other than the first to seventh verify voltages VV1 to VV7 may be used.

Figure 5A:
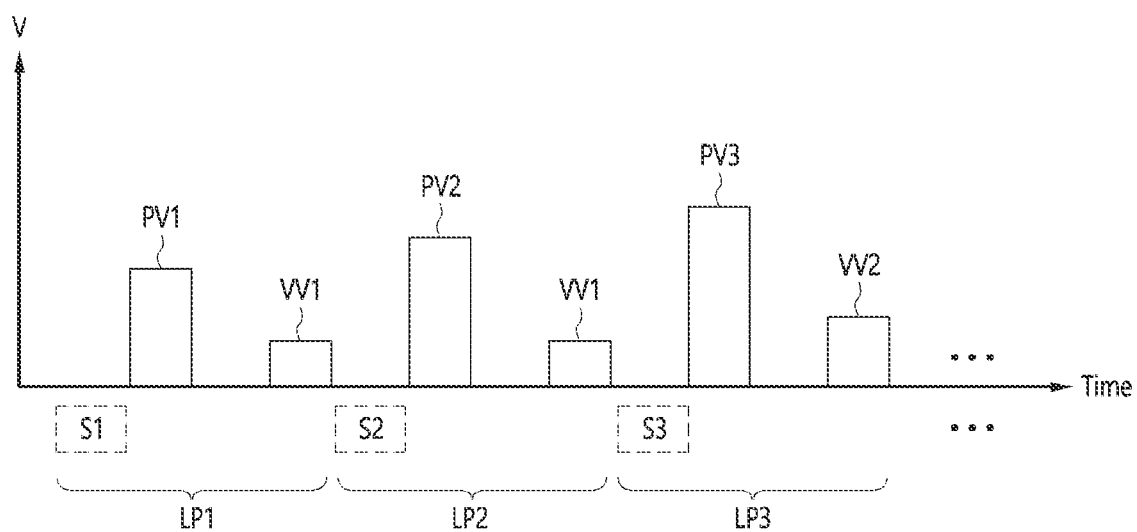
FIGS. 5A and 5B are diagrams for an example program operation in accordance with an embodiment of the present disclosure.
Figure 5B:
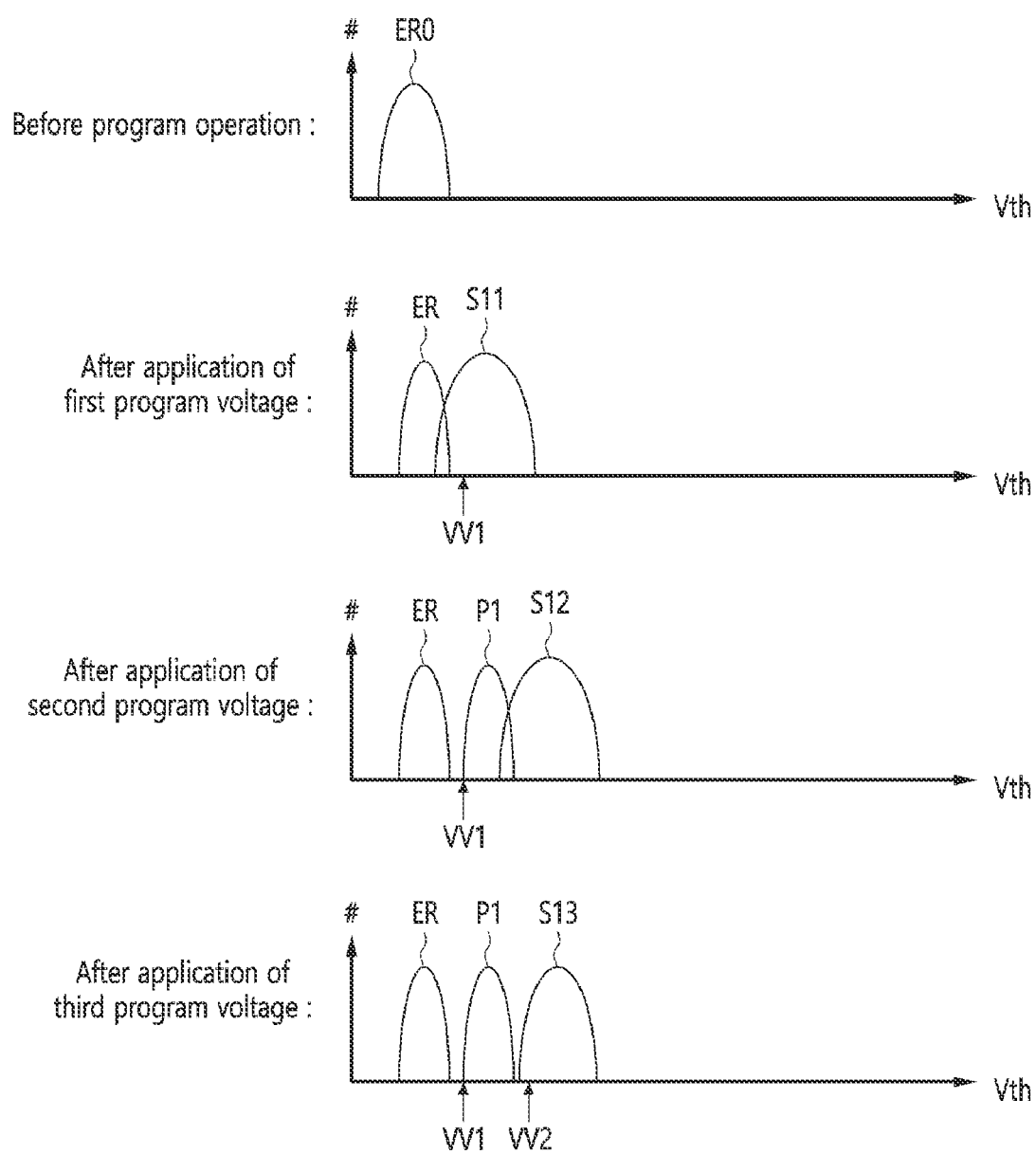

FIGS. 5A and 5B are diagrams for an example program operation in accordance with an embodiment of the present disclosure. In the graph of FIG. 5A, the horizontal axis indicates passage of time, and the vertical axis V indicates a voltage level. FIG. 5B shows changes in threshold voltages of target memory cells in a program operation.

Referring to FIG. 5A, a program operation may be performed according to an incremental step pulse program (ISPP) scheme. The program operation may include a plurality of program loops including first to third program loops LP1 to LP3. First to third program voltages PV1 to PV3 in the first to third program loops LP1 to LP3, respectively, may rise stepwise. Each program loop may include a program voltage application operation and a verify voltage application operation. The program voltage application operation may include applying a program voltage to a target word line to raise threshold voltages of target memory cells. The verify voltage application operation may include applying one or more verify voltages to the target word line to verify threshold voltages of the target memory cells. FIG. 5A shows an embodiment in which one verify voltage is applied in the verify voltage application operation of each program loop.

In each program loop, a program setup operation may be performed before a program voltage is applied. For example, in the first program loop LP1, a first program setup operation S1 may be performed before the first program voltage PV1 is applied. The program setup operation may include determining program prohibition memory cells and program permission memory cells among target memory cells with respect to a program voltage to be subsequently applied. The program prohibition memory cell may be a target memory cell that should not be affected by the program voltage. In other words, the program prohibition memory cell may be a target memory cell whose threshold voltage should be maintained as it is even when the program voltage is applied to the target word line. If a target memory cell is determined to be a program prohibition memory cell at a certain point of time, the target memory cell may be continuously maintained as a program prohibition memory cell even in subsequent program loops. The program permission memory cell may be a target memory cell whose threshold voltage should be affected by the program voltage.

The program setup operation may further include applying a program prohibition voltage to bit lines of the program prohibition memory cells (or precharging the program prohibition memory cells with a program prohibition voltage) and applying a program permission voltage to bit lines of the program permission memory cells (or precharging the program permission memory cells with a program permission voltage). The program prohibition voltage may be a voltage higher than the program permission voltage. For example, the program prohibition voltage may be a power supply voltage and the program permission voltage may be a ground voltage (0V). Accordingly, as the program prohibition voltage is applied to the bit line, the program prohibition memory cell may not be affected by the program voltage applied to the target word line. As the program permission voltage is applied to the bit line, the program permission memory cell may be affected by the program voltage applied to the target word line, and the threshold voltage of the program permission memory cell may be raised.

The first program loop LP1 will be described in detail below. In the first program setup operation S1, based on the program data received from the external device 200, target memory cells that should be maintained in the erased state ER may be determined to be program prohibition memory cells, and target memory cells that should be programmed to one of the first to seventh program states P1 to P7 may be determined to be program permission memory cells. When the program prohibition memory cells and the program permission memory cells are determined, each of the bit lines BL1 to BLm may be precharged with a program prohibition voltage or a program permission voltage. The first program voltage PV1 may be initially applied to the target word line, and charges may flow into the program permission memory cells to raise the threshold voltages of the program permission memory cells. Subsequently, the first verify voltage VV1 may be applied to the target word line, data may be read from the target memory cells, and each of the target memory cells may be determined to be a "program pass" or a "program fail" based on the read data and the program data.

In the second program loop LP2, a second program setup operation S2 may be performed before the second program voltage PV2 is applied. In the second program setup operation S2, target memory cells determined to be a "program pass" in the first program loop LP1 may be added as program prohibition memory cells, and target memory cells determined to be a "program fail" in the first program loop LP1 may be determined to be program permission memory cells. When program prohibition memory cells and program permission memory cells are determined for the second program loop LP2, each of the bit lines BL1 to BLm may be precharged with a program prohibition voltage or a program permission voltage. The application of the second program voltage PV2 and the first verify voltage VV1 may be performed in the same manner as described above in the first program loop LP1. If all of target memory cells that should be in the first program state P1 are determined to be "program passes" in the second program loop LP2, the second verify voltage VV2 for verifying the second program state P2 may be applied from the third program loop LP3.

According to an embodiment, in each program loop, two or more verify voltages may be applied to more precisely determine the state of a target memory cell.

According to an embodiment, when a voltage of a different level other than a program permission voltage and a program prohibition voltage may be further applied to a bit line, a program setup operation may further include determining a target memory cell that is to be applied with the voltage of the difference level through the bit line.

Referring to FIG. 5B, before the program operation is started, the target memory cells may be in an erased state ER0.

After the first program voltage PV1 is applied, each target memory cell may be in an erased state ER or a state S11. For example, as threshold voltages of the program permission memory cells are raised by the first program voltage PV1, the program permission memory cells that were in the erased state ER0 may transition to state S11. The program prohibition memory cells may remain in the erased state ER.

After the second program voltage PV2 is applied, each target memory cell may be in the erased state ER, the first program state P1, or a state S12. For example, as threshold voltages of program permission memory cells are further raised by the second program voltage PV2, the program permission memory cells that were in state S11 may transition to state S12. After the second program voltage PV2 is applied, all target memory cells that should be in the first program state P1 may be determined to be "program passes."

After the third program voltage PV3 is applied, each target memory cell may be in the erased state ER, the first program state P1, or state S13. For example, as threshold voltages of program permission memory cells are further raised by the third program voltage PV3, the program permission memory cells that were in state S12 may transition to state S13.

Figure 6A:
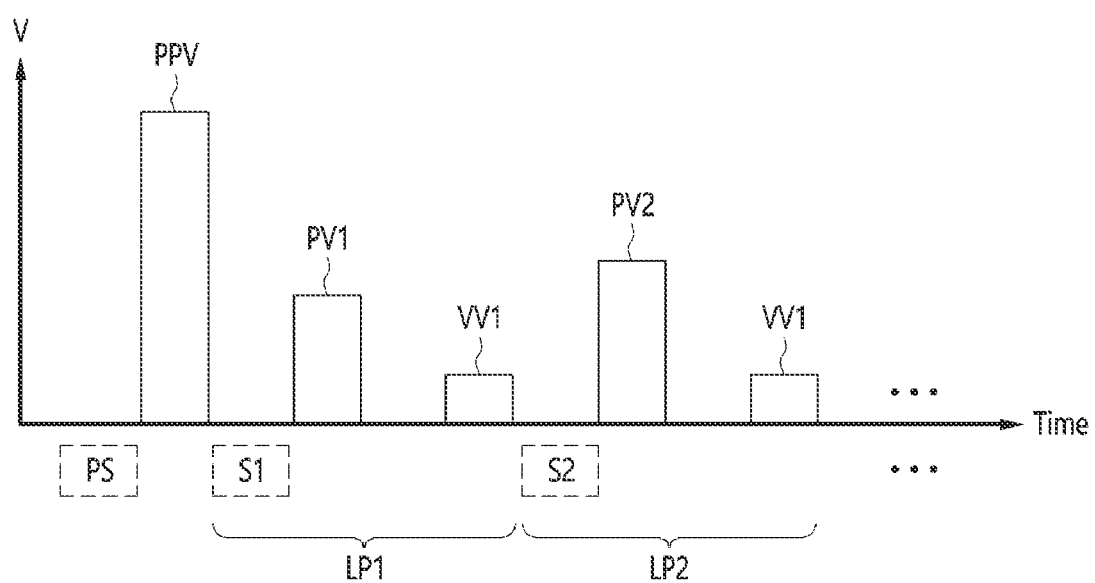
FIGS. 6A and 6B are diagrams for an example pre-program voltage application operation in accordance with an embodiment of the present disclosure.
Figure 6B:
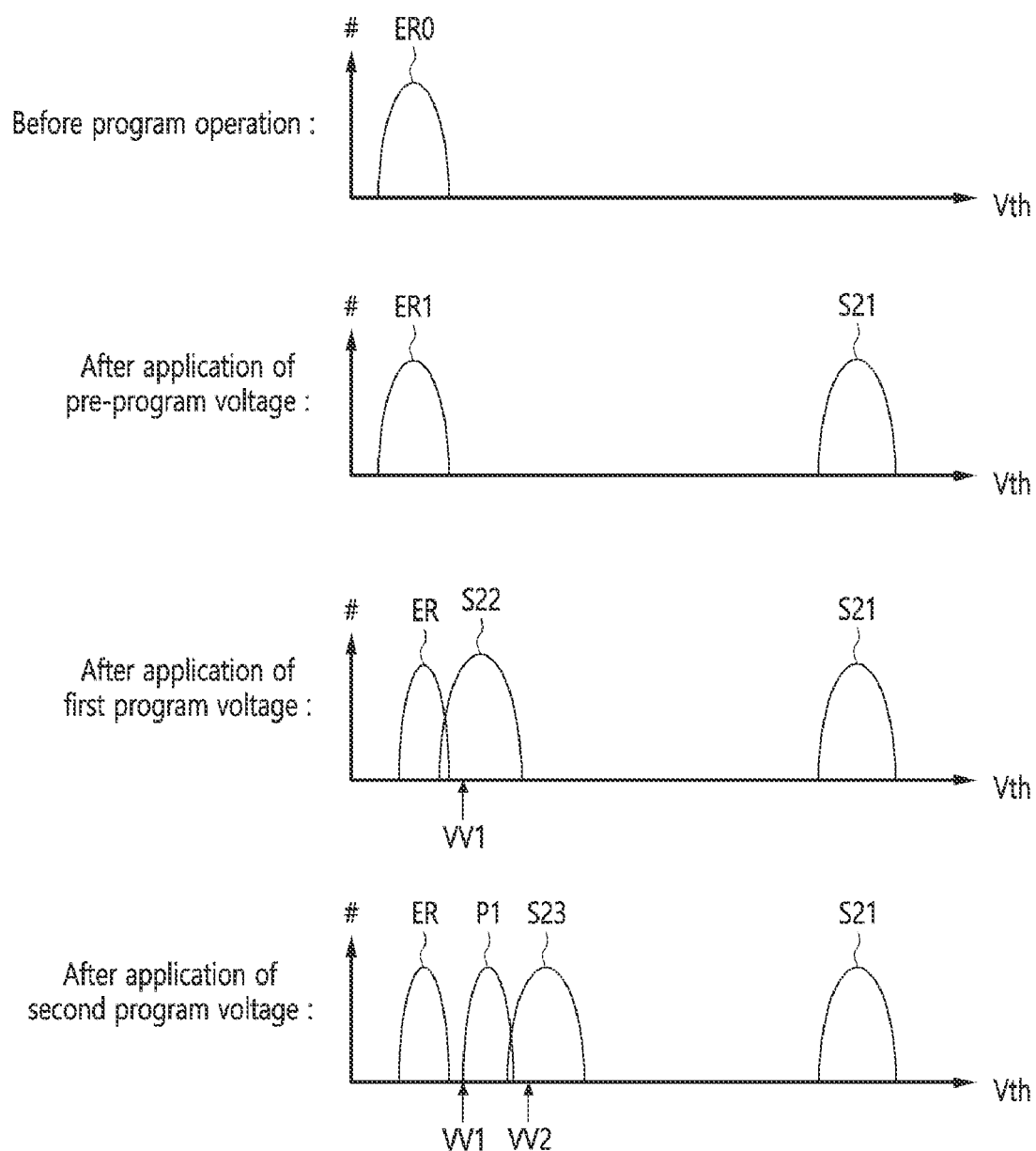

FIGS. 6A and 6B are diagrams for an example pre-program voltage application operation in accordance with an embodiment of the present disclosure. In the graph of FIG. 6A, the horizontal axis indicates passage of time, and the vertical axis V indicates a voltage level. FIG. 6B shows changes in threshold voltages of target memory cells in a program operation in which a pre-program voltage application operation is performed.

Referring to FIG. 6A, before applying the first program voltage PV1, a pre-program voltage application operation of applying a pre-program voltage PPV to the target word line may be performed. The voltage level of the pre-program voltage PPV may be higher than the voltage level of the first program voltage PV1.

A pre-program setup operation PS may be performed before the pre-program voltage PPV is applied. The pre-program setup operation PS may include determining program prohibition memory cells and program permission memory cells among the target memory cells with respect to the pre-program voltage PPV. The program permission memory cells with respect to the pre-program voltage PPV may be target memory cells that are to be programmed to a respective one of the selected program states among the first to seventh program states P1 to P7. The one or more selected program states may include an upper program state, for example, the seventh program state P7. The program prohibition memory cells with respect to the pre-program voltage PPV may be target memory cells that are not the program permission memory cells.

The pre-program voltage application operation may be performed to more stably form an upper program state. In detail, when the pre-program voltage application operation is not performed, shallowly trapped charges may be in a target memory cell that becomes an upper program state, and the corresponding charges may deteriorate data reliability according to the retention characteristics of the target memory cell. However, when the pre-program voltage application operation is performed on the corresponding target memory cell, shallowly trapped charges may be discharged while the program operation is performed, and thus, after the program operation is performed, the upper program state may be more stably maintained, and data reliability may increase.

Referring to FIG. 6B, before the program operation is started, the target memory cells may be in an erased state ER0.

After the pre-program voltage PPV is applied, each target memory cell may be in the erased state ER or a state S21. For example, as the threshold voltages of program permission memory cells (i.e., target memory cells that should be in an upper program state) are raised by the pre-program voltage PPV, the program permission memory cells that have been in the erased state ER0 may transition to state S21.

After the first program voltage PV1 is applied, a target memory cell may be in an erased state ER or one of the states S21 and S22. For example, as the threshold voltages of program permission memory cells are raised by the first program voltage PV1, the program permission memory cells that were in the erased state ER may transition to state S22.

After the second program voltage PV2 is applied, a target memory cell may be in the erased state ER, the first program state P1, or one of the states S21 and S23. For example, as the threshold voltages of program permission memory cells are further raised by the second program voltage PV2, the program permission memory cells that have been in state S22 may transition to state S23.

Figures 7, 8A:
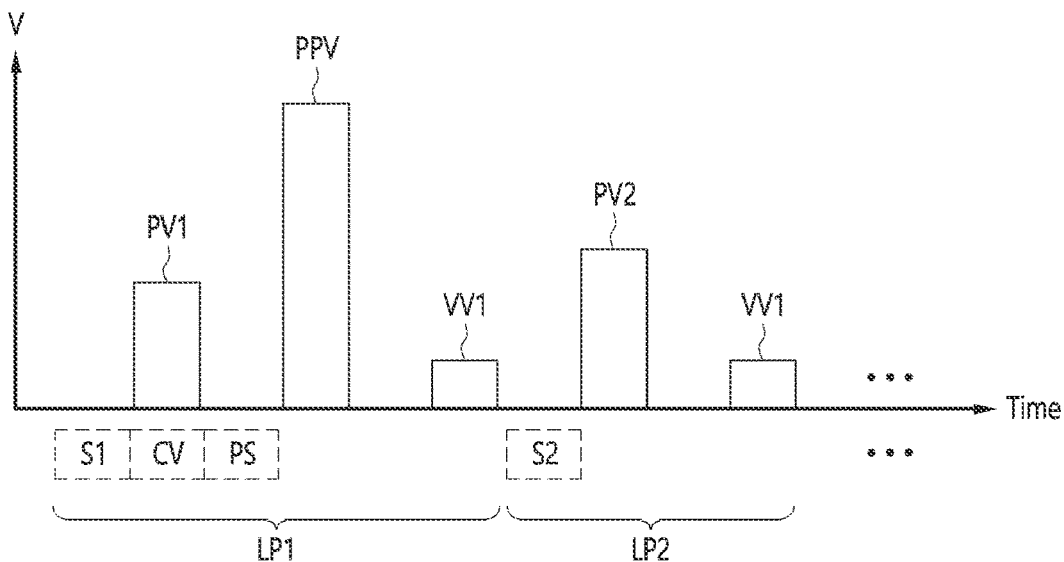
FIG. 7 is a diagram for an example data conversion operation on a TLC in accordance with an embodiment of the present disclosure.
FIGS. 8A and 8B are diagrams illustrating an example program operation in accordance with an embodiment of the present disclosure.

FIG. 7 is a diagram for an example data conversion operation on a TLC in accordance with an embodiment of the present disclosure.

Referring to FIG. 7, program data PRGDT may be data received together with a program command from, for example, the external device 200 for a program operation. The program data PRGDT may be received by at least one buffer of the buffer group 122 that is coupled to a target memory cell.

The aforementioned program setup operation may be performed based on the program data PRGDT. For example, the first program setup operation S1 may include identifying to which state among the erased state ER and the first to seventh program states P1 to P7 the program data PRGDT corresponds. When the program data PRGDT corresponds to the erased state ER, the buffer group 122 may determine the target memory cell as a program prohibition memory cell and may store a first value in a latch included in the buffer group 122. On the other hand, when the program data PRGDT corresponds to any one of the first to seventh program states P1 to P7, the buffer group 122 may determine the target memory cell as a program permission memory cell and may store a second value in the latch.

The buffer group 122 may apply a program prohibition voltage to a bit line when the latch stores the first value and may apply a program permission voltage to the bit line when the latch stores the second value.

According to the circuit configuration of a buffer in the buffer group 122, the buffer may identify a state corresponding to the program data PRGDT by identifying a predetermined value such as, for example, 0, of the program data PRGDT. For example, it may be identified that the program data PRGDT corresponding to the seventh program state P7 includes 0 as a central significant bit (CSB).

However, because the program data PRGDT corresponding to the second, third and sixth program states P2, P3 and P6 also includes 0 as the CSB, in order to distinguish the seventh program state P7 from the second, third and sixth program states P2, P3 and P6, it may be necessary to further identify a least significant bit (LSB) and a most significant bit (MSB) of the program data PRGDT. Furthermore, because the patterns of the program data PRGDT corresponding to the first to seventh program states P1 to P7, respectively, are not regularly arranged, identification may be more difficult. Accordingly, the program setup operation of identifying the seventh program state P7 based on the program data PRGDT may take time. In this case, because the pre-program voltage application operation may be performed after first identifying the seventh program state P7 through the pre-program setup operation PS, the total program time may increase.

Therefore, in an effort to reduce the total program time, the buffer group 122 may perform a data conversion operation of converting the program data PRGDT into converted data CVDT. The data conversion operation may be performed to shorten a performance time of the program setup operation and to simplify the circuit configuration of the buffer. Namely, the program setup operation based on the converted data CVDT may be performed faster than the program setup operation based on the program data PRGDT. Moreover, the converted data CVDT may be identified more quickly by a buffer that is configured to be a simpler circuit. The shown converted data CVDT is an example, and various converted data CVDT that may improve the performance of a program operation may be applied. For each specific pattern of the program data PRGDT, a specific pattern of the corresponding converted data CVDT may be predetermined.

When the data conversion operation is performed, the program data PRGDT may be converted into the converted data CVDT. The buffer group 122 may perform the program operation based on the converted data CVDT. For example, before the data conversion operation is performed, the buffer may determine based on the program data PRGDT of 101 that the target memory cell corresponds to the seventh program state P7, but, after the data conversion operation is performed, the buffer may determine on the basis of the converted data CVDT of 011 that the target memory cell corresponds to the seventh program state P7. According to the configuration of the buffer, identifying the seventh program state P7 based on the converted data CVDT of 011 may be performed more efficiently than identifying the seventh program state P7 based on the program data PRGDT of 101. Because, unlike the program data PRGDT, the converted data CVDT respectively corresponding to the erase state ER and the program states P1 to P7 may be arranged according to a simple rule, a state corresponding to the converted data CVDT may be identified more simply. However, when the data conversion operation is performed sequentially by itself, the data conversion operation may serve as a factor that increases a total program time.

Figure 8B:
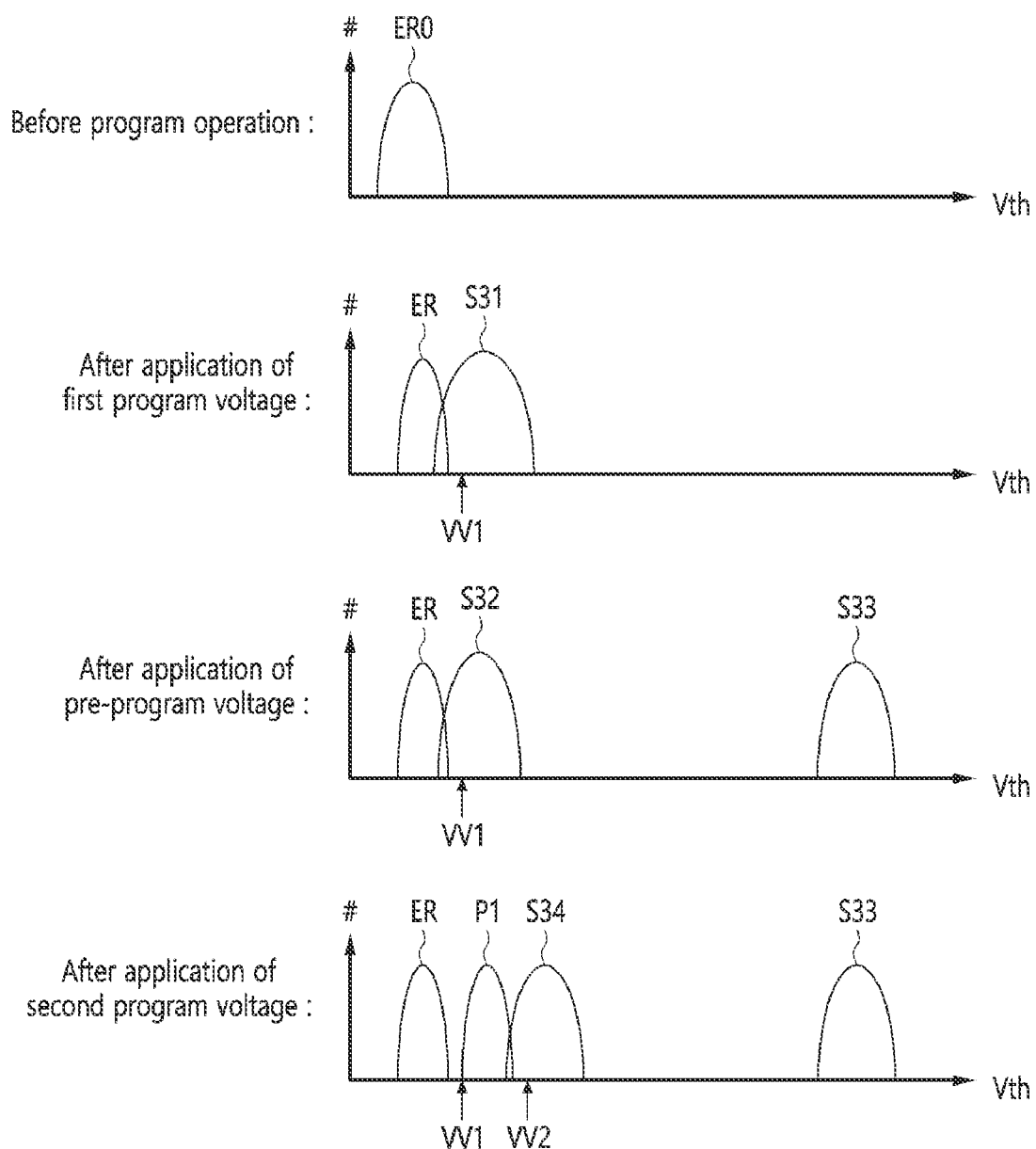

FIGS. 8A and 8B are diagrams illustrating a method of performing a program operation in accordance with an embodiment of the present disclosure. According to an embodiment of the present disclosure, the program operation may be performed according to a modified ISPP scheme.

Referring to FIGS. 7 and 8A, in a first program loop LP1 of the program operation, a first program voltage PV1, a pre-program voltage PPV, and a first verify voltage VV1 may be sequentially applied.

In detail, the buffer group 122 may perform a first program setup operation S1 before the first program voltage PV1 is applied. The first program setup operation S1 may include determining program permission memory cells and program prohibition memory cells based on the program data PRGDT received by the buffer group 122. In the first program setup operation S1, target memory cells that should be maintained in the erased state ER may be determined to be the program prohibition memory cells, and target memory cells that should be in the first to seventh program states P1 to P7 may be determined to be the program permission memory cells.

The first program setup operation S1 may be completed relatively quickly. In detail, as described above with reference to FIG. 7, when the buffer is configured to identify a state corresponding to the program data PRGDT by identifying 0 of the program data PRGDT, because the program data PRGDT of the erased state ER does not include 0 at all and the program data PRGDT of each of the first to seventh program states P1 to P7 includes at least one 0, whether or not the program data PRGDT corresponds to the erased state ER may be easily identified. Accordingly, because the first program setup operation S1 only needs to identify whether or not the program data PRGDT corresponds to the erased state ER and does not need to identify to which program state of the first to seventh program states P1 to P7 the program data PRGDT corresponds, the first program setup operation S1 may be quickly completed.

After the first program setup operation S1 is performed, the decoder 123 may apply the first program voltage PV1 to the target word line. When the first program voltage PV1 is applied to the target word line, charges may flow into the program permission memory cells to raise the threshold voltages of the program permission memory cells. Because the threshold voltages of the program prohibition memory cells are maintained as they are without being affected by the first program voltage PV1, the program prohibition memory cells may remain in the erased state ER.

In an embodiment, the buffer group 122 may perform a data conversion operation CV in parallel with the first program voltage application operation, and may store the converted data CVDT instead of the program data PRGDT. That is, at least a part of the first program voltage application operation and at least a part of the data conversion operation CV may be performed simultaneously. By performing the data conversion operation CV in parallel with the first program voltage application operation, there may not be an increase in the total program time.

Subsequently, before the pre-program voltage PPV is applied, the buffer group 122 may perform a pre-program setup operation PS. The pre-program setup operation PS may include determining program permission memory cells and program prohibition memory cells based on the converted data CVDT. In the pre-program setup operation PS, target memory cells that should go to an upper program state, for example, the seventh program state P7, may be determined to be the program permission memory cells, and target memory cells except the program permission memory cells may be determined to be the program prohibition memory cells. Because the example pre-program setup operation PS of FIG. 8A is performed based on the converted data CVDT, the pre-program setup operation PS of FIG. 8A may be quickly performed.

After the pre-program setup operation PS is performed, the decoder 123 may apply the pre-program voltage PPV to the target word line. The threshold voltages of the program permission memory cells may be raised by the pre-program voltage PPV. The threshold voltages of the program prohibition memory cells may be maintained as they are without being affected by the pre-program voltage PPV.

Then, the decoder 123 may apply the first verify voltage VV1 to the target word line. When the first verify voltage VV1 is applied to the target word line, a target memory cell that should be in any one of the first to seventh program states P1 to P7 should be turned off, and a target memory cell that should be maintained in the erased state ER should be turned on. Accordingly, by identifying a state corresponding to the converted data CVDT and referring to data read by the first verify voltage VV1, the buffer may determine whether a target memory cell is a "program pass" or a "program fail."

The buffer may proceed with a second program loop LP2 similarly to that described above with reference to FIG. 5A. Thereafter, although not shown, the memory device 100 may continue to perform the program operation according to the ISPP scheme.

Referring to FIG. 8B, before the example program operation is started, the target memory cells may be in an erased state ER0.

After the first program voltage PV1 is applied, a target memory cell may be in an erased state ER or a state S31. For example, as the threshold voltages of program permission memory cells are raised by the first program voltage PV1, the program permission memory cells that were in the erased state ER0 may transition to state S31.

After the pre-program voltage PPV is applied, a target memory cell may be in one of the erased state ER, state S32, or state S33. For example, as the threshold voltages of program permission memory cells (i.e., target memory cells that should be in an upper program state) are raised by the pre-program voltage PPV, the program permission memory cells that were in state S31 may transition to state S33.

After the second program voltage PV2 is applied, a target memory cell may be in one of the erased state ER, the first program state P1, state S33, or state S34. For example, as the threshold voltages of program permission memory cells are further raised by the second program voltage PV2, the program permission memory cells that were in state S32 may transition to state S34.

In summary, by applying the first program voltage PV1 before the pre-program voltage PPV, the performance time of the data conversion operation CV may not affect the total program time, and the pre-program setup operation PS may be quickly performed. As a result, the program time may be shortened.

Figure 9:
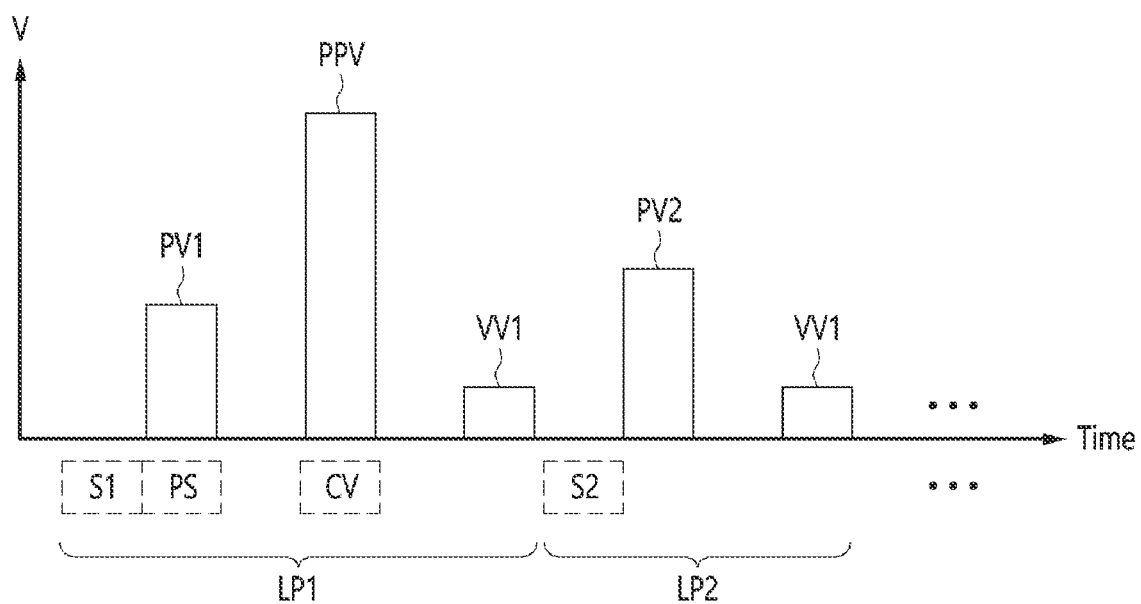
FIG. 9 is a diagram illustrating an example program operation in accordance with an embodiment of the present disclosure.

FIG. 9 is a diagram illustrating an example method of performing a program operation in accordance with an embodiment of the present disclosure.

Referring to FIG. 9, unlike the embodiment of FIG. 8A, the pre-program setup operation PS may be performed earlier than the data conversion operation CV.

In detail, the buffer group 122 may perform the pre-program setup operation PS in parallel with the first program voltage application operation of applying the first program voltage PV1. In other words, at least a part of the first program voltage application operation and at least a part of the pre-program setup operation PS may be performed simultaneously. Since the pre-program setup operation PS of FIG. 9 is performed earlier than the data conversion operation CV, the pre-program setup operation PS of FIG. 9 may be performed based on the program data PRGDT. Namely, because the pre-program setup operation PS based on the program data PRGDT may take some time but may be performed at least partially in parallel while the first program voltage application operation is performed, the performance of the memory device 100 may be improved compared to the case where the pre-program setup operation PS based on the program data PRGDT is performed by itself (e.g., the case shown in FIG. 6A).

In addition, the buffer group 122 may perform the data conversion operation CV in parallel with the pre-program voltage application operation of applying the pre-program voltage PPV. That is, at least a part of the pre-program voltage application operation and at least a part of the data conversion operation CV may be performed simultaneously. By performing the data conversion operation CV in parallel with the pre-program voltage application operation, the total program time may be reduced.

As a result, by applying the first program voltage PV1 before applying the pre-program voltage PPV, the performance time of the pre-program setup operation PS and the data conversion operation CV may not affect the total program time, thereby allowing for improvements in the performance of the memory device 100.

Figure 10:
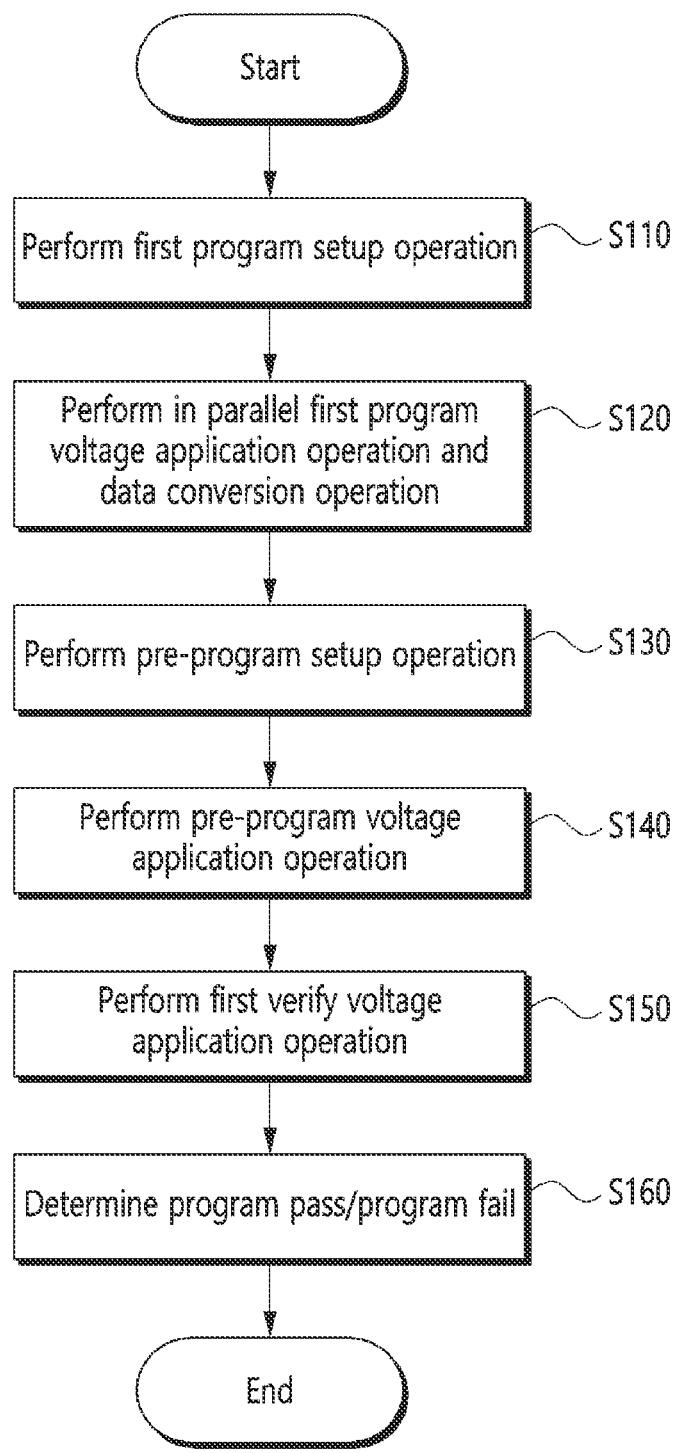
FIG. 10 is a flowchart illustrating an example method of performing a first program loop of a program operation in accordance with an embodiment of the present disclosure.

FIG. 10 is a flowchart illustrating an example method of performing the first program loop LP1 of a program operation in accordance with an embodiment of the present disclosure.

Referring to FIGS. 1, 8A, and 10 together, at step S110, the peripheral circuit 120 may perform a first program setup operation for a first program voltage application operation, based on the program data received from, for example, the external device 200.

At step S120, the peripheral circuit 120 may perform in parallel the first program voltage application operation and the data conversion operation. The data conversion operation may convert the program data into converted data.

At step S130, the peripheral circuit 120 may perform a pre-program setup operation for a pre-program voltage application operation based on the converted data.

At step S140, the peripheral circuit 120 may perform the pre-program voltage application operation.

At step S150, the peripheral circuit 120 may perform a first verify voltage application operation.

At step S160, based on the converted data and data read through the first verify voltage application operation, the peripheral circuit 120 may determine whether each target memory cell is a "program pass" or a "program fail."

Figure 11:
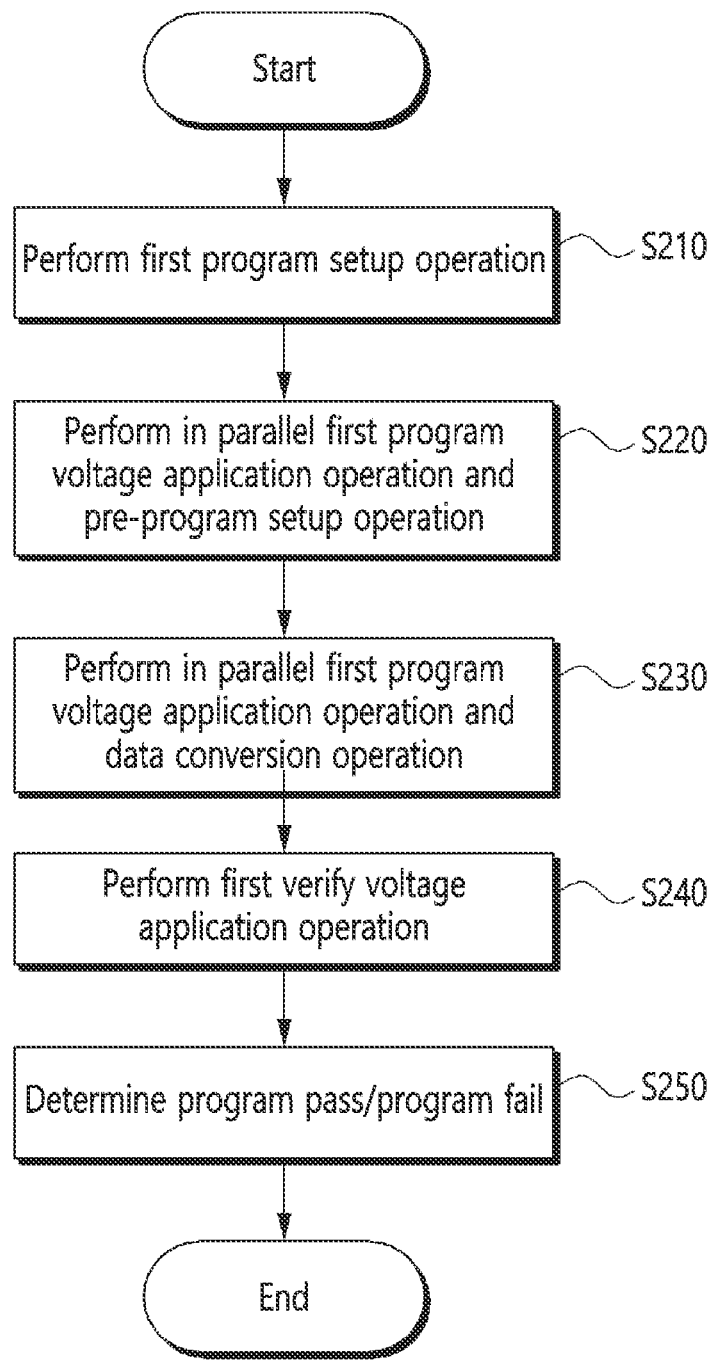
FIG. 11 is a flowchart illustrating an example method of performing a first program loop of a program operation in accordance with an embodiment of the present disclosure.

FIG. 11 is a flowchart illustrating an example method of performing the first program loop LP1 of a program operation in accordance with an embodiment of the present disclosure.

Referring to FIGS. 1, 9, and 11 together, at step S210, the peripheral circuit 120 may perform a first program setup operation for a first program voltage application operation based on the program data received from, for example, the external device 200.

At step S220, the peripheral circuit 120 may perform in parallel the first program voltage application operation and a pre-program setup operation for a pre-program voltage application operation.

At step S230, the peripheral circuit 120 may perform in parallel the pre-program voltage application operation and a data conversion operation. By the data conversion operation, the program data may be converted into converted data.

At step S240, the peripheral circuit 120 may perform a first verify voltage application operation.

At step S250, based on the converted data and the data read through the first verify voltage application operation, the peripheral circuit 120 may determine whether each target memory cell is a "program pass" or a "program fail."

Those skilled in the art to which the present disclosure pertains will understand that the present disclosure may be implemented in other detailed forms without changing the technical spirit or essential characteristics of the present disclosure.

Accordingly, the aforementioned embodiments should not be construed as being limiting but should be construed as being only illustrative from all aspects. The scope of the present disclosure is disclosed as a whole including in the appended claims, and it should be understood that all modifications or variations derived from the meanings and scope of the present disclosure and equivalents thereof are included.

What is claimed is:

1. A memory device comprising:
a plurality of memory cells each configured to be in an erased state or one of a plurality of program states according to data stored therein; and
a peripheral circuit configured to, in a program operation on the plurality of memory cells,
perform a first program voltage application operation on first memory cells among the plurality of memory cells, the first memory cells being to be programmed to first respective program states; and
perform, after the first program voltage application operation and before a first verify voltage application operation on the first memory cells, a pre-program voltage application operation on second memory cells among the plurality of memory cells, the second memory cells being to be programmed to second respective program states.

2. The memory device according to claim 1, wherein the peripheral circuit is configured to perform the first verify voltage application operation after the pre-program voltage application operation is performed.

3. The memory device according to claim 1, wherein the peripheral circuit is configured to include in the second respective program states a most significant program state from among the first respective program states.

4. The memory device according to claim 1, wherein the peripheral circuit is configured to:
determine the first memory cells on the basis of program data received from a device external to the peripheral circuit, and
perform a first program setup operation on the first memory cells before performing the first program voltage application operation.

5. The memory device according to claim 1, wherein the peripheral circuit is configured to perform a data conversion operation in parallel with the first program voltage application operation.

6. The memory device according to claim 5, wherein the data conversion operation includes converting the program data received from a device external to the peripheral circuit into converted data.

7. The memory device according to claim 6, wherein the peripheral circuit is configured to:
determine the second memory cells on the basis of the converted data, and
perform a pre-program setup operation on the second memory cells before performing the pre-program voltage application operation.

8. The memory device according to claim 1, wherein the peripheral circuit is configured to perform a pre-program setup operation in parallel with the first program voltage application operation.

9. The memory device according to claim 8, wherein the peripheral circuit is configured to determine the second memory cells on the basis of program data received from a device external to the peripheral circuit.

10. The memory device according to claim 9, wherein the peripheral circuit is configured to perform a data conversion operation in parallel with the pre-program voltage application operation,
wherein the data conversion operation includes converting the program data received from a device external to the peripheral circuit into converted data.

11. A memory device comprising:
a plurality of memory cells each configured to be in an erased state or one of a plurality of program states according to data stored therein; and
a peripheral circuit configured to, in a program operation on the plurality of memory cells:
perform a first program voltage application operation on first memory cells among the plurality of memory cells;
perform, after the first program voltage application operation and before a first verify voltage application operation on the first memory cells, a pre-program voltage application operation on second memory cells among the first memory cells; and
perform a data conversion operation in parallel with the pre-program voltage application operation.

12. The memory device according to claim 11, wherein the peripheral circuit is configured to perform the first verify voltage application operation after performing the pre-program voltage application operation.

13. The memory device according to claim 11, wherein the peripheral circuit is configured to:

determine as the first memory cells at least a portion of the plurality of the memory cells to be in first respective program states, and determine as the second memory cells at least a portion of the first memory cells that are to be in respective selected program states.

14. The memory device according to claim 13, wherein the selected program states include a most significant program state among the plurality of program states.

15. The memory device according to claim 11, wherein the peripheral circuit is configured to:

determine the first memory cells on the basis of program data received from a device external to the peripheral circuit, and perform a first program setup operation on the first memory cells before performing the first program voltage application operation.

16. The memory device according to claim 11, wherein the peripheral circuit is configured to:

determine the second memory cells on the basis of program data received from a device external to the peripheral circuit, and perform a pre-program setup operation in parallel with the first program voltage application operation.

17. The memory device according to claim 11, wherein the data conversion operation includes converting program data received from a device external to the peripheral circuit into converted data.

18. A program method of memory device comprising:

applying a first program voltage to first memory cells among a plurality of memory cells, the first memory cells being to be programmed to first respective program states among a plurality of program states, and applying, after applying the first program voltage to the first memory cells and before applying a first verify voltage to the first memory cells, a pre-program voltage higher than the first program voltage to second memory cells among the plurality of memory cells, the second memory cells being to be programmed to second respective program states among the plurality of program states.

19. The program method memory device-according to claim 18, further comprising converting program data received from an external device into converted data while applying the first program voltage.

20. The program method according to claim 18, further comprising converting program data received from an external device into converted data while applying the pre-program voltage.

21. The program method according to claim 18, further comprising applying the first verify voltage to the first memory cells after applying the pre-program voltage.

* * * * *